(12) United States Patent
Sapp

(10) Patent No.: US 6,710,418 B1
(45) Date of Patent: Mar. 23, 2004

(54) SCHOTTKY RECTIFIER WITH INSULATION-FILLED TRENCHES AND METHOD OF FORMING THE SAME

(75) Inventor: Steven P. Sapp, Santa Cruz, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/269,244

(22) Filed: Oct. 11, 2002

(51) Int. Cl.⁷ ............................................. H01L 25/095
(52) U.S. Cl. ..................... 257/471; 257/475; 257/508; 257/596; 257/154; 257/168
(58) Field of Search ................. 257/471, 475, 257/472, 476, 508, 596–600, 154, 155, 168

(56) References Cited

U.S. PATENT DOCUMENTS

| | | |
|---|---|---|
| 3,404,295 A | 10/1968 | Warner et al. |
| 3,412,297 A | 11/1968 | Amlinger |
| 3,497,777 A | 2/1970 | Teszner et al. |
| 3,564,356 A | 2/1971 | Wilson |
| 4,003,072 A | 1/1977 | Matsushita et al. |
| 4,300,150 A | 11/1981 | Colak |
| 4,326,332 A | 4/1982 | Kenney et al. |
| 4,337,474 A | 6/1982 | Yukimoto |
| 4,579,621 A | 4/1986 | Hine |
| 4,638,344 A | 1/1987 | Cardwell, Jr. |
| 4,639,761 A | 1/1987 | Singer et al. |
| 4,698,653 A | 10/1987 | Cardwell, Jr. |
| 4,716,126 A | 12/1987 | Cogan |
| 4,746,630 A | 5/1988 | Hui et al. |
| 4,754,310 A | 6/1988 | Coe |
| 4,774,556 A | 9/1988 | Fujii et al. |
| 4,821,095 A | 4/1989 | Temple |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,967,245 A | 10/1990 | Cogan et al. |
| 4,974,059 A | 11/1990 | Kinzer |
| 4,990,463 A | 2/1991 | Mori |
| 4,992,390 A | 2/1991 | Chang |
| 5,027,180 A | 6/1991 | Nishizawa et al. |
| 5,071,782 A | 12/1991 | Mori |
| 5,072,266 A | 12/1991 | Buluccea |
| 5,079,608 A | 1/1992 | Wodarczyk et al. |
| 5,105,243 A | 4/1992 | Nakagawa et al. |
| 5,164,325 A | 11/1992 | Cogan et al. |

(List continued on next page.)

FOREIGN PATENT DOCUMENTS

| | | |
|---|---|---|
| DE | 4300806 A2 | 12/1993 |
| DE | 19736981 A1 | 8/1998 |
| EP | 0975024 A2 | 1/2000 |

(List continued on next page.)

OTHER PUBLICATIONS

Baliga "New Concepts in Power Rectifiers," Physics of Semiconductor Devices, Proceedings of the Third Int'l Workshop, Madras (India), Committee on Science and Technology in Developing Countries(1985).

(List continued on next page.)

*Primary Examiner*—Nathan J. Flynn
*Assistant Examiner*—Remmon R. Fordé
(74) *Attorney, Agent, or Firm*—Townsend and Townsend and Crew LLP

(57) ABSTRACT

In accordance with an embodiment of the present invention, a semiconductor rectifier includes an insulation-filled trench formed in a semiconductor region. Strips of resistive material extend along the trench sidewalls. The strips of resistive material have a conductivity type opposite that of the semiconductor region. A conductor extends over and in contact with the semiconductor region so that the conductor and the underlying semiconductor region form a Schottky contact.

14 Claims, 2 Drawing Sheets

U.S. PATENT DOCUMENTS

| | | |
|---|---|---|
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,262,336 A | 11/1993 | Pike, Jr. et al. |
| 5,268,311 A | 12/1993 | Euen et al. |
| 5,275,965 A | 1/1994 | Manning |
| 5,294,824 A | 3/1994 | Okada |
| 5,298,781 A | 3/1994 | Cogan et al. |
| 5,300,447 A | 4/1994 | Anderson |
| 5,326,711 A | 7/1994 | Malhi |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,436,189 A | 7/1995 | Beasom |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,519,245 A | 5/1996 | Tokura et al. |
| 5,541,425 A | 7/1996 | Nishihara |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,595,927 A | 1/1997 | Chen et al. |
| 5,597,765 A | 1/1997 | Yilmaz et al. |
| 5,605,852 A | 2/1997 | Bencuya |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,719,409 A | 2/1998 | Singh et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,877,528 A | 3/1999 | So |
| 5,879,971 A | 3/1999 | Witek |
| 5,879,994 A | 3/1999 | Kwan et al. |
| 5,895,951 A | 4/1999 | So et al. |
| 5,895,952 A | 4/1999 | Darwish et al. |
| 5,897,360 A | 4/1999 | Kawaguchi |
| 5,906,680 A | 5/1999 | Meyerson |
| 5,917,216 A | 6/1999 | Floyd et al. |
| 5,929,481 A | 7/1999 | Hsieh et al. |
| 5,943,581 A | 8/1999 | Lu et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,976,936 A | 11/1999 | Miyajima et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenny et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,049,108 A | 4/2000 | Williams et al. |
| 6,057,558 A | 5/2000 | Yamamoto et al. |
| 6,066,878 A | 5/2000 | Neilson |
| 6,081,009 A | 6/2000 | Neilson |
| 6,084,264 A | 7/2000 | Darwish |
| 6,084,268 A | 7/2000 | de Frésart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,104,054 A | 8/2000 | Corsi et al. |
| 6,110,799 A | 8/2000 | Huang |
| 6,114,727 A | 9/2000 | Ogura et al. |
| 6,137,152 A | 10/2000 | Wu |
| 6,156,606 A | 12/2000 | Michaelis |
| 6,156,611 A | 12/2000 | Lan et al. |
| 6,163,052 A | 12/2000 | Liu et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,773 B1 | 1/2001 | Fujishima |
| 6,174,785 B1 | 1/2001 | Parekh et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,191,447 B1 | 2/2001 | Baliga |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,225,649 B1 | 5/2001 | Minato |
| 6,228,727 B1 | 5/2001 | Lim et al. |
| 6,239,464 B1 | 5/2001 | Tsuchitani et al. |
| 6,265,269 B1 | 7/2001 | Chen et al. |
| 6,271,100 B1 | 8/2001 | Ballantine et al. |
| 6,271,562 B1 | 8/2001 | Deboy et al. |
| 6,274,905 B1 | 8/2001 | Mo |
| 6,277,706 B1 | 8/2001 | Ishikawa |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,303,969 B1 * | 10/2001 | Tan ............................. 257/484 |
| 6,307,246 B1 * | 10/2001 | Nitta et al. ................. 257/493 |
| 6,309,920 B1 | 10/2001 | Laska et al. |
| 6,313,482 B1 | 11/2001 | Baliga |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,353,252 B1 | 3/2002 | Yasuhara et al. |
| 6,359,308 B1 | 3/2002 | Hijzen et al. |

| | | | |
|---|---|---|---|
| 6,362,112 B1 | 3/2002 | Hamerski | |
| 6,362,505 B1 | 3/2002 | Tihanyi | |
| 6,365,462 B2 | 4/2002 | Baliga | |
| 6,365,930 B1 | 4/2002 | Schillaci et al. | |
| 6,368,920 B1 | 4/2002 | Beasom | |
| 6,368,921 B1 | 4/2002 | Hijzen et al. | |
| 6,376,314 B1 | 4/2002 | Jerred | |
| 6,376,878 B1 | 4/2002 | Kocon | |
| 6,376,890 B1 | 4/2002 | Tihanyi | |
| 6,384,456 B1 | 5/2002 | Tihanyi | |
| 6,388,286 B1 | 5/2002 | Baliga | |
| 6,388,287 B2 | 5/2002 | Deboy et al. | |
| 6,400,003 B1 | 6/2002 | Huang | |
| 6,433,385 B1 | 8/2002 | Kocon et al. | |
| 6,436,779 B2 | 8/2002 | Hurkx et al. | |
| 6,437,399 B1 | 8/2002 | Huang | |
| 6,441,454 B2 * | 8/2002 | Hijzen et al. | 257/483 |
| 6,452,230 B1 | 9/2002 | Boden, Jr. | |
| 6,465,304 B1 | 10/2002 | Blanchard et al. | |
| 6,465,843 B1 | 10/2002 | Hirler et al. | |
| 6,465,869 B2 | 10/2002 | Ahlers et al. | |
| 6,472,678 B1 | 10/2002 | Hshieh et al. | |
| 6,472,708 B1 | 10/2002 | Hshieh et al. | |
| 6,475,884 B2 | 11/2002 | Hshieh et al. | |
| 6,476,443 B1 | 11/2002 | Kinzer | |
| 6,479,352 B2 | 11/2002 | Blanchard | |
| 6,501,146 B1 * | 12/2002 | Harada | 257/475 |
| 2001/0023961 A1 | 9/2001 | Hsieh et al. | |
| 2001/0028083 A1 | 10/2001 | Onishi et al. | |
| 2001/0032998 A1 | 10/2001 | Iwamoto et al. | |
| 2001/0041400 A1 | 11/2001 | Ren et al. | |
| 2001/0049167 A1 | 12/2001 | Madson | |
| 2001/0050394 A1 | 12/2001 | Onishi et al. | |
| 2002/0009832 A1 | 1/2002 | Blanchard | |
| 2002/0014658 A1 | 2/2002 | Blanchard | |
| 2002/0066924 A1 | 6/2002 | Blanchard | |
| 2002/0070418 A1 | 6/2002 | Kinzer et al. | |

FOREIGN PATENT DOCUMENTS

| | | | |
|---|---|---|---|
| EP | 1026749 A1 | 8/2000 | |
| EP | 1054451 A2 | 11/2000 | |
| EP | 0747967 B1 | 2/2002 | |
| EP | 1205980 A1 | 5/2002 | |
| JP | 62-069562 | 3/1987 | |
| JP | 63-186475 | 8/1988 | |
| JP | 63-288047 | 11/1988 | |
| JP | 64-022051 | 1/1989 | |
| JP | 01-192174 | 8/1989 | |
| JP | 05226638 A * | 9/1993 | |
| JP | 05226638 A | 9/1993 | |
| JP | 2000-040822 | 2/2000 | |
| JP | 2000-040872 | 2/2000 | |
| JP | 2000-156978 A | 6/2000 | |
| JP | 2000-277726 A | 10/2000 | |
| JP | 2000-277728 A | 10/2000 | |
| JP | 2001-015448 | 1/2001 | |
| JP | 2001-015752 | 1/2001 | |
| JP | 2001-111041 A | 2/2001 | |
| JP | 2001-102577 A | 4/2001 | |
| JP | 2001-135819 A | 5/2001 | |
| JP | 2001-144292 A | 5/2001 | |
| JP | 2001-244461 A | 9/2001 | |
| JP | 2001-313391 A | 11/2001 | |
| JP | 2002-083976 A | 3/2002 | |
| JP | 2002083976 A * | 3/2002 | |
| WO | WO 00/33386 A2 | 6/2000 | |
| WO | WO 00/68997 A1 | 11/2000 | |
| WO | WO 00/68998 A1 | 11/2000 | |
| WO | WO 00/75965 A2 | 12/2000 | |
| WO | WO 01/06550 A1 | 1/2001 | |
| WO | WO 01/06557 A1 | 1/2001 | |
| WO | WO 01/45155 A1 | 6/2001 | |
| WO | WO 01/59847 A2 | 8/2001 | |
| WO | WO 01/71815 | 9/2001 | |
| WO | WO 01/95385 A1 | 12/2001 | |
| WO | WO 01/95398 A1 | 12/2001 | |
| WO | WO 02/01644 A2 | 1/2002 | |
| WO | WO 02/047171 A1 | 6/2002 | |

OTHER PUBLICATIONS

Baliga "Options for CVD of Dielectrics Include Low–k Materials," Technical Literature from Semiconductor International Jun. 1998.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275–278.

Bulucea "Trench DMOS Transistor Technology For High Current (100 A Range) Switching" Solid–State Electronics vol. 34 No. pp. 493–507 (1991).

Chang et al. "Numerical and experimental Analysis of 500–V Power DMOSFET with an Atomic–Lattice Layout," IEEE Transactions on Electron Devices 36:2623 (1989).

Chang et al. "Self–Aligned UMOSFET's with a Specific On–Resistance of $1m\Omega\ cm^2$," IEEE Transactions on Electron Devices 34:2329–2333 (1987).

Curtis, et al. "APCVD TEOS: 03 Advanced Trench Isolation Applications," Semiconductor Fabtech 9th Edition (1999).

Darwish et al. A New Power W–Gated Trench MOSFET (WMOSFET) with High Switching Performance. ISPSD Proceedings—Apr. 2003, Cambridge.

Fujihira "Theory of Semiconductor Superjunction Devices" Jpn. J. Appl. Phys. Vol 36 pp. 6254–6252 (1997).

Gan et al. "Poly Flanked VDMOS (PFVDMOS): A Superior Technology for Superjunction Devices," IEEE Power Electronics Specialists Conference, Jun. 17–22, 2001, Vancouver, Canada (2001).

Glenn et al. "A Novel Vertical Deep Trench RESURF DMOS (VTR–DMOS)" IEEE ISPD May 22–25, 2000 Toulouse France.

Kao et al. "Two Dimensional Thermal Oxidation of Silicon–I. Experiments,", IEEE Transactions on Electron Devices, vol. ED–34,No. 5, May 1987.

Kao et al. "Two Dimensional Thermal Oxidation of Silicon–II. Modeling Stress Effects in Wet Oxides,", IEEE Transactions on Electron Devices, vol. ED–35, No. 1, Jan. 1988.

Lorenz et al. "COOL MOS– An important milestone towards a new power MOSFET generation" Power Conversion pp. 151–160 (1988).

Moghadam "Delivering Value Around New Industry Paradigms," Technical Literature from Applied Materials, pages 1–11, vol. 1, Issue 2, Nov. 1999.

Shenoy et al." Analysis of the Effect of Charge Imbalance on the Static and Dynamic Characteristic of the Super Junction MOSFET," IEEE International Symposium on Power Semiconductor Devices 1999, pp. 99–102 (1999).

Singer "Empty Spaces in Silicon (ESS): An Alternative to SOI," Semiconductor International p. 42, Dec. 1999.

Ueda et al. "An Ultra–Low On–Resistance Power MOSFET Fabricated by Using a Fully Self–Aligned Process," IEEE Transactions on Electron Devices 34:926–930 (1987).

Wilamowski "Schottky Diodes with High Breakdown Voltages," Solid–State Electronics 26: 491–493 (1983).

Wolf " Silicon Processing for The VLSI Era" vol. 2 Process Integration Lattice Press (1990).

"CoolMOS™ the second generation," Infineon Technologies product information (2000).

"IR develops CoolMOS™ –equivalent technology, positions it at the top of a 3–tiered line of new products for SMPS," International Rectifiers company information available at http://www.irf.com (1999).

Technical Literature from Quester Technology, Model APT–4300 300mm Atmospheric TEOS/Ozone CVD System (unknown date).

Technical Literature from Quester Technology, Model APT–6000 Atmospheric TEOS–Ozone CVD System (unknown date).

Technical Literature from Silicon Valley Group Thermal Systems. APNext, High Throughput APCVD Cluster Tool for 200 mm/300 mm Wafer Processing (unknown date).

* cited by examiner

SCHOTTKY RECTIFIER WITH INSULATION-FILLED TRENCHES AND METHOD OF FORMING THE SAME

BACKGROUND OF THE INVENTION

The present invention relates in general to semiconductor technology and in particular to improved Schottky rectifier structures and methods of manufacturing the same.

Silicon-based power rectifiers are well known and have been used in power electronic systems for many decades. Silicon Schottky rectifiers have generally been used in applications operating at mid to low voltages due to their lower on-state voltage drop and faster switching speed. A conventional planar Schottky rectifier structure is shown in FIG. 1A. A top metal electrode forms a Schottky contact with the underlying semiconductor region 106. The traditional method of optimizing this rectifier changes the Schottky contact metal to alter the barrier height. Although the on-state voltage drop can be reduced by decreasing the barrier height, the reverse leakage current increases exponentially leading to unstable operation at high temperatures. Attempts to improve upon this tradeoff between on-state and reverse blocking power losses has led to the development of the junction barrier controlled Schottky (JBS) structure shown in FIG. 1B.

In FIG. 1B, closely-spaced p-type regions 114 are formed in n-type region 112. A top metal electrode 113 forms a Schottky contact with the surface area of n-type region 112 between p-type regions 114, and forms an ohmic contact with p-type regions 114. The pn junction formed by p-type regions 114 and n-type region 112 forms a potential barrier below the Schottky contact, resulting in a lower electric field at the metal-semiconductor interface. The resulting suppression of the barrier height lowering responsible for the poor reverse leakage in these devices allowed some improvements in the power loss tradeoff. However, the Schottky contact area through which the on-state current flows is reduced due the lateral diffusion of p-type regions 114, and the series resistance is increased by current constriction between the junctions.

Further performance improvements have been obtained by the incorporation of a trench MOS region under the Schottky contact to create the trench MOS-barrier Schottky (TMBS) rectifier structure shown in FIG. 1C. The MOS structure greatly reduces the electric field under the Schottky contact while enabling the support of voltages far in excess of the parallel-plane breakdown voltage in mesa region 119. This allows optimizing mesa region 119 to have a higher diping concentration thus reducing the rectifier's on state voltage drop A further improvement in the electric field distribution under the Schottky contact has been obtained by using a graded doping profile in the mesa region.

It has been observed however, that the TMBS structure suffers from high leakage due to phosphorous segregation at the oxide-silicon interface. The increased phosphorous concentration reduces the accumulation threshold on the mesa sidewalls and increases the leakage current. Further, the TMBS and JBS structures have higher capacitance due to the presence of MOS structures 118 in the TMBS structure and the presence of p-type regions 114 in the JBS structure.

Thus, Schottky rectifiers having a low forward voltage, high reverse breakdown voltage, and low capacitance which do not suffer from high leakage are desirable.

BRIEF SUMMARY OF THE INVENTION

In accordance with an embodiment of the present invention, a semiconductor rectifier includes an insulation-filled trench formed in a semiconductor region. Strips of resistive material extend along the trench sidewalls. The strips of resistive material have a conductivity type opposite that of the semiconductor region. A conductor extends over and in contact with the semiconductor region so that the conductor and the underlying semiconductor region form a Schottky contact.

In one embodiment, the semiconductor region is formed over a substrate, and the substrate and the semiconductor region have the same conductivity type.

In another embodiment, the strips of resistive material are discontinuous along the bottom of the insulation-filled trench.

In another embodiment, the strips of resistive material comprise doped silicon material.

In another embodiment, the conductor is in contact with the strips of resistive material.

In another embodiment, the strips of resistive material comprise silicon material having a doping concentration of about four to five times greater than a doping concentration of the semiconductor region.

In accordance with another embodiment of the present invention, a semiconductor rectifier is formed as follows. A trench is formed in a semiconductor region. Strips of resistive material are formed along the trench sidewalls. The strips of resistive material have a conductivity type opposite that of the semiconductor region. The trench is substantially filled with insulating material. A conductor is formed over and in contact with the semiconductor region so that the conductor and the underlying semiconductor region form a Schottky contact.

In another embodiment, the semiconductor region is formed over a substrate, and the substrate and the semiconductor region have the same conductivity type.

In another embodiment, the strips of resistive material are discontinuous along the bottom of the trench.

In another embodiment, the strips of resistive material comprise silicon material having a doping concentration of about four to five times greater than a doping concentration of the semiconductor region.

The following detailed description and the accompanying drawings provide a better understanding of the nature and advantages of the present invention.

DETAILED DESCRIPTION OF THE INVENTION

Embodiments of a semiconductor Schottky rectifier with insulation-filled trenches and method of forming the same are described in accordance with the invention. Strips of resistive elements extending along the trench sidewalls result in high breakdown voltage, enabling the doping concentration of the mesa region to be increased so that a lower forward voltage is obtained. Further, by filling the trenches with insulation rather than silicon material, a far lower device capacitance is achieved.

Figure 1A:
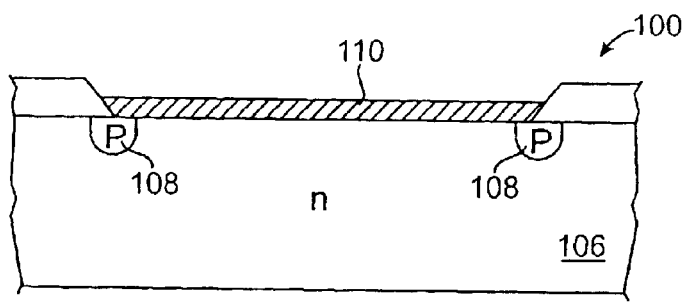
FIGS. 1A, 1B, and 1C show cross-section views of three known Schottky rectifier structures.
Figure 1B:
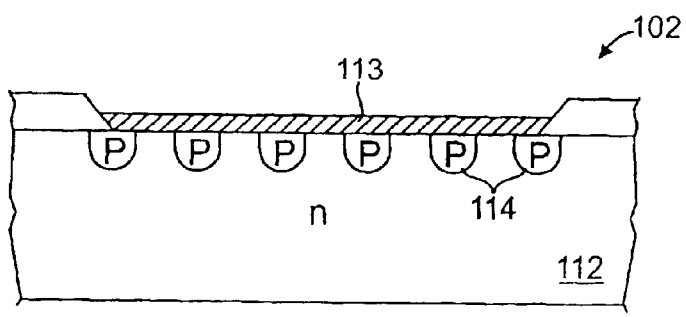
Figure 1C:
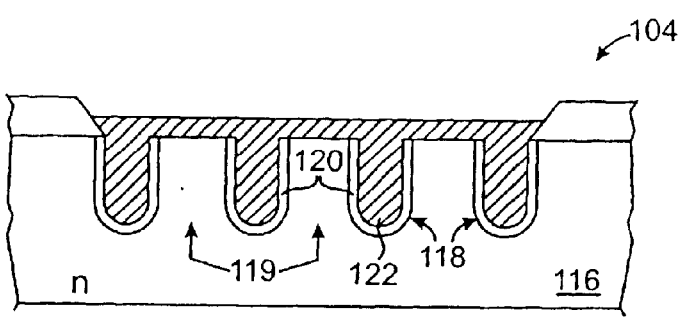
Figure 2:
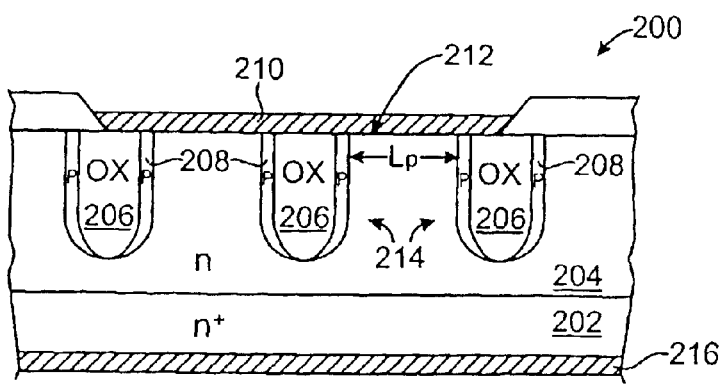
FIG. 2 shows a cross-section view of a Schottky rectifier structure in accordance with an embodiment of the present invention.

FIG. 2 shows a cross-section view of a Schottky rectifier structure 200 in accordance with an embodiment of the present invention. An epitaxial layer 204 over a substrate 202 includes a plurality of insulation-filled trenches 214 extending from a top surface of epitaxial layer 204 to a predetermined depth. Each trench 214 is lined with a strip 208 of lightly-doped silicon material along its sidewalls. Silicon strips 208 are of opposite conductivity type to epitaxial layer 204 and substrate 202. A conductoer 210, e.g., from metal, extending along the top surface forms the anode electrode of rectifier 200. Conductor 210 forms a Schottky contact with the underlying epitaxial layer 204, and also contacts silicon strips 208 at the top. Another conductor 216 extending along the bottom surface contacts substrate 202 and forms the cathode electrode of rectifier 200.

Silicon strips 208 influence the vertical charge distribution in the mesa region such that the electric field spreads deeper into the mesa region resulting in a more uniform field throughout the depth of the mesa region. A higher breakdown voltage is thus achieved. Strips 208 also prevent the low accumulation threshold of the TMBS structure thus eliminating the high leakage problem of the TMBS structure. Further, trenches 214 can be made as narrow as the process technology allows, thus increasing the Schottky contact area. Moreover, because a significant portion of the space charge region is supported in the insulation-filled trenches, the capacitance of the rectifier is substantially reduced. This is because the permitivity of insulators is greater than silicon (e.g., four times greater for oxide).

In one embodiment wherein a breakdown voltage of 80–100V is desired, epitaxial layer 204 has a doping concentration in the range of $5 \times 10^{15}$ to $1 \times 10^{16}$ cm$^{-3}$ and strips 208 have a doping concentration of about 5–10 times that of epitaxial layer 204. The doping concentration in p strips 208 impacts the capacitance of the rectifier. Highly-doped p strips lead to higher capacitance since a higher reverse bias potential is needed to fully deplete the p strips. Thus, if capacitance reduction is a design goal, then a low doping concentration would be more desirable for p strips 208.

To achieve effective vertical charge control, spacing Lp between adjacent strips 208 needs to be carefully engineered. In one embodiment, spacing Lp is determined in accordance with the following proposition: the product of the doping concentration in the mesa region and the spacing Lp be in the range of $2 \times 10^{12}$ to $4 \times 10^{12}$ cm$^{-2}$. Thus, for example, for a mesa region doping concentration of $5 \times 10^{15}$ cm$^{-3}$, the spacing Lp needs to be about 4 $\mu$m.

Figure 3A:
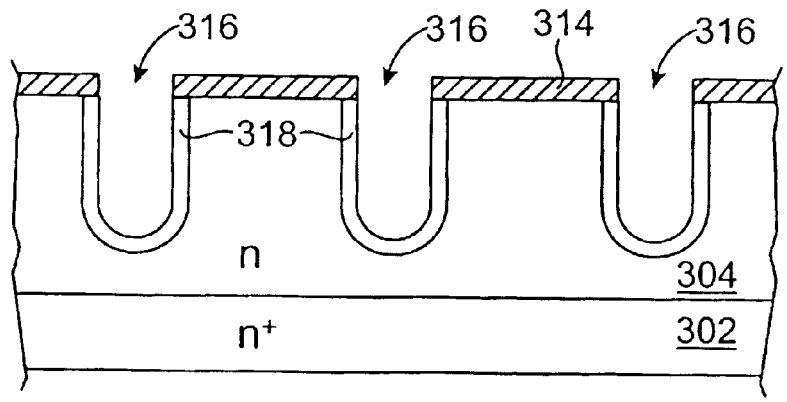
FIGS. 3A, 3B, and 3C show cross-section views at different process steps exemplifying one method for manufacturing the Schottky rectifier structure in FIG. 2 in accordance with an embodiment of the invention.
Figure 3B:
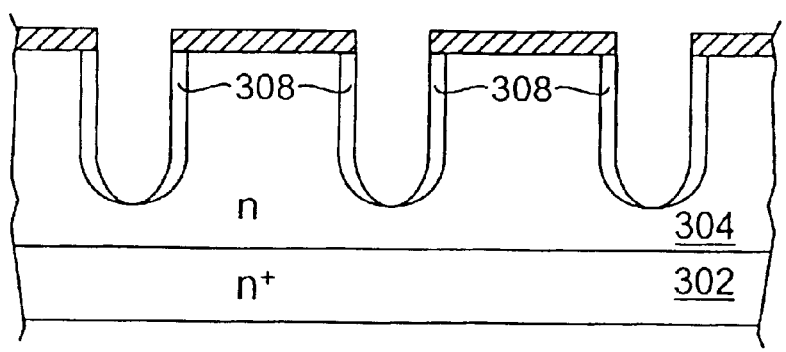
Figure 3C:
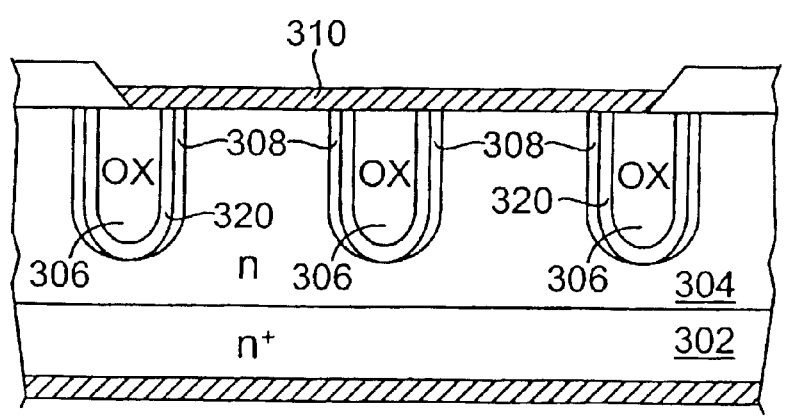

FIGS. 3A, 3B, and 3C show cross-section views at different process steps exemplifying one method for manufacturing the Schottky rectifier structure in FIG. 2 in accordance with an embodiment of the invention. In FIG. 3A, a hard mask 314 along with conventional silicon trench etch methods are used to etch epitaxial layer 304 to form trench openings 316. Using the same mask 314, p liners 318 are formed by implanting p-type impurities at about a 20° angle into both sidewalls and bottom of the trenches using conventional methods. In FIG. 3B, the portion of p liners 318 along the bottom of the trenches are removed using conventional silicon etch methods, thus leaving p strips 308 along the sidewalls of the trenches. In FIG. 3C, a thermally-grown oxide layer 320 is formed along the inner sidewalls and bottom of each trench. The p-type dopants in p strips 308 are then activated using conventional methods. Conventional oxide deposition steps (e.g., SOG method) are carried out to fill the trenches with oxide, followed by planarization of the oxide surface. Note that in the FIG. 2 structure the thermally grown oxide liners, similar to those in FIG. 3C, are present but not shown for simplicity. The thermally grown oxide layers are included to provide a cleaner interface between the trench insulator and the p strips.

While the above is a complete description of the embodiments of the present invention, it is possible to use various alternatives, modifications and equivalents. For example, the cross-sectional views are intended for depiction of the various regions in the different structures and do not necessarily limit the layout or other structural aspects of the cell array. Further, the trenches may be terminated at a shallower depth within in the epitaxial layer, or alternatively extended to terminate at the substrate. Also, the p strips along the trench sidewalls may be insulated from the top electrode so that they float. Therefore, the scope of the present invention should be determined not with reference to the above description but should, instead, be determined with reference to the appended claim, along with their full scope of equivalents.

What is claimed is:

1. A semiconductor Schottky rectifier comprising:
   a semiconductor region;
   insulation-filled trench in the semiconductor region;
   strips of resistive material extending along the trench sidewalls, the strips of resistive material having a conductivity type opposite that of the semiconductor region; and
   a conductor extending over and in contact with the semiconductor region so that the conductor and the underlying semiconductor region form a Schottky contact through which a substantial portion of a current flows when the Schottky rectifier is forward biased.

2. The semiconductor rectifier of claim 1 further comprising a substrate over which the semiconductor region is formed, the substrate and the semiconductor region having the same conductivity type.

3. The semiconductor rectifier of claim 2 wherein the insulation-filled trench terminates at a junction formed by the semiconductor region and the substrate.

4. The semiconductor rectifier of claim 1 wherein the strips of resistive material are discontinuous along the bottom of the insulation-filled trench.

5. The semiconductor rectifier of claim 1 wherein the strips of resistive material comprise doped silicon material.

6. The semiconductor rectifier of claim 1 wherein the insulation-filled trench terminates within the semiconductor region.

7. The semiconductor rectifier of claim 1 wherein the conductor is in contact with the strips of resistive material.

8. The semiconductor rectifier of claim 1 wherein the conductor is insulated from the strips of resistive material.

9. The semiconductor rectifier of claim 1 wherein the strips of resistive material comprise silicon material having a doping concentration of about four to five times greater than a doping concentration of the semiconductor region.

10. A semiconductor rectifier comprising:
    a substrate;
    a semiconductor region formed over the substrate, the substrate and the region having the same conductivity type.
    at least two insulation-filled trenches laterally spaced in the first semiconductor region to form a mesa region therebetween; and strips of resistive material extending along the sidewalls of the at least two trenches but being discontinuous along the bottom of the at least two trenches, the strips of resistive material having a conductivity type opposite that of the semiconductor region; and a conductor extending over and in contact with the semiconductor region so that the conductor and the underlying semiconductor region form a Schottky contact.

11. The semiconductor rectifier of claim 10 wherein the strips of resistive material comprise doped silicon material.

12. The semiconductor rectifier of claim 10 wherein the insulation-filled trench terminates within the semiconductor region.

13. The semiconductor rectifier of claim 10 wherein the conductor is in contact with the strips of resistive material.

14. The semiconductor rectifier of claim 10 wherein the strips of resistive material comprise silicon material having a doping concentration of about four to five times greater than a doping concentration of the semiconductor region.

* * * * *